US009054772B2

(12) United States Patent  
Schmidhammer

(10) Patent No.: US 9,054,772 B2
(45) Date of Patent: Jun. 9, 2015

(54) ADAPTIVE IMPEDANCE MATCHING CIRCUIT AND METHOD FOR MATCHING FOR DUPLEX OPERATION STANDARDS

(75) Inventor: Edgar Schmidhammer, Stein an der Traun (DE)

(73) Assignee: Qualcomm Technologies, Inc., San Diego, CA (US)

( * ) Notice: Subject to any disclaimer, the term of this patent is extended or adjusted under 35 U.S.C. 154(b) by 862 days.

(21) Appl. No.: 12/692,071

(22) Filed: Jan. 22, 2010

(65) Prior Publication Data

US 2010/0182216 A1 Jul. 22, 2010

(30) Foreign Application Priority Data

Jan. 22, 2009 (DE) .................. 10 2009 005 710
Jun. 12, 2009 (DE) .................. 10 2009 024 747

(51) Int. Cl.
*H01Q 1/50* (2006.01)
*H04B 1/18* (2006.01)
*H03H 7/40* (2006.01)
*H04B 1/04* (2006.01)

(52) U.S. Cl.
CPC . *H04B 1/18* (2013.01); *H03H 7/40* (2013.01); *H04B 1/0458* (2013.01)

(58) Field of Classification Search
CPC .......... H03H 7/40; H04B 1/0458; H04B 1/18; H01Q 1/50

USPC ........ 343/850, 860, 700 MS, 861; 455/193.1; 333/17.3, 32

See application file for complete search history.

(56) References Cited

U.S. PATENT DOCUMENTS

| | | | | | |
|---|---|---|---|---|---|
| 5,589,844 | A | * | 12/1996 | Belcher et al. | 343/860 |
| 6,198,441 | B1 | * | 3/2001 | Okabe et al. | 343/702 |
| 6,501,427 | B1 | * | 12/2002 | Lilly et al. | 343/700 MS |
| 6,765,540 | B2 | * | 7/2004 | Toncich | 343/860 |
| 7,528,674 | B2 | | 5/2009 | Kato et al. | |
| 7,633,355 | B2 | | 12/2009 | Matsuo | |
| 7,852,170 | B2 | * | 12/2010 | McKinzie, III | 333/17.3 |
| 2007/0210899 | A1 | | 9/2007 | Kato et al. | |
| 2008/0238569 | A1 | | 10/2008 | Matsuo | |

FOREIGN PATENT DOCUMENTS

| | | |
|---|---|---|
| EP | 1 729 412 A1 | 12/2006 |
| EP | 1 845 627 A1 | 10/2007 |
| JP | 60080323 A | 5/1985 |
| WO | WO 2007055175 A1 | 5/2007 |

\* cited by examiner

*Primary Examiner* — Michael C Wimer
(74) *Attorney, Agent, or Firm* — Smith Risley Tempel Santos LLC

(57) ABSTRACT

A method for the impedance matching of front end circuits to antennas in mutually different transmission and reception frequency ranges is specified. A suitable matching circuit is furthermore specified. The impedance matching in a transmission frequency range is determined such that an excessively poor impedance matching in a reception frequency range is prevented in this case.

41 Claims, 7 Drawing Sheets

ADAPTIVE IMPEDANCE MATCHING CIRCUIT AND METHOD FOR MATCHING FOR DUPLEX OPERATION STANDARDS

This application claims priority to German Patent Application 10 2009 005 710.2, which was filed Jan. 22, 2009 and German Patent Application 10 2009 024 747.5, which was filed Jun. 12, 2009, each of which is incorporated herein by reference.

TECHNICAL FIELD

The invention relates to an adaptive impedance matching circuit and a method for matching for duplex operation standards.

BACKGROUND

The antennas of mobile communication devices, in particular, planar antennas, react to a change in their surroundings by a change in their impedance. The transmission coefficient is dependent on the impedance matching between a front end circuit of a mobile communication device and the antenna, the transmission coefficient describing in the case of transmission signals that fraction of the power from the front end circuit which is emitted via the antenna. At the same time, the transmission coefficient of reception signals which are received via the antenna and are forwarded to the front end circuit is also dependent on the degree of impedance matching. In order, for a given emitted power, to minimize the power to be expended for this in the front end circuit or in order to be able to obtain a good reception signal, it is correspondingly important for the front end circuit and the antenna to be impedance-matched to one another.

In previous TDD (Time Division Duplexing) methods, an adaptive matching circuit serves for dynamically matching the impedance of the front end circuit to the variable impedance of the antenna. In such a system, different frequency ranges are generally used for transmission signals and reception signals. Since the processes of transmission and reception take place alternately temporally in so-called time slots (for example, in the case of the GSM standard), however, impedance matching is only necessary for the frequency range currently in use.

The situation is different in the case of radio standards which enable simultaneous transmission and reception (FDD methods, Frequency Division Duplexing), such as the European W-CDMA standard, for example. Transmission signals are communicated in transmission frequency ranges (so-called "uplink" frequencies), whereas reception signals are communicated in so-called "downlink" frequencies. Such frequency ranges are additionally separated from one another by the so-called band gap arranged therebetween. Therefore, an FDD impedance matching circuit typically has to enable sufficient matching in a frequency range which simultaneously serves transmission and reception frequency ranges.

A further problem in relation to impedance matching circuits known from the prior art is that the present matching circuit is electrically connected between a duplexer and the antenna, whereas there is usually no duplexer provided in TDD systems. A duplexer is a necessary part of an FDD front end circuit which serves as a frequency-separating network and, owing to its own frequency-dependent impedance, makes it more difficult to achieve sufficient impedance matching.

SUMMARY

In one aspect, the invention specifies an impedance matching circuit which accomplishes the impedance matching between a duplexer or a front end module and the antenna of a mobile communication device in the FDD mode simultaneously both in a transmission frequency range and in a reception frequency range. In a further aspect, the invention specifies a simple, but powerful, stable and fast method by which the impedance matching between duplexer (or front end module) and antenna can be carried out. On account of the fact that dynamic matching of the impedance between front end circuit and antenna is necessary, the success of the matching is dependent on the combination of a suitable matching network and an effective method. Consequently, in particular aspects, the present invention specifies such a matching network together with an algorithm designed therefor in order to achieve good antenna matching.

A method for the impedance matching of a front end circuit and of a planar antenna in a selected transmission frequency range and a selected reception frequency range, includes:
A) selecting a band,
B) setting initial impedances of the tunable impedance elements for the selected band,
C) determining the initial impedance matching of the matching circuit for the transmission frequency range of the selected band,
D) determining and setting new impedances of the tunable impedance elements,
E) determining the impedance matching of the matching circuit with the new impedances for transmission frequency ranges,
F) continuing with step D.

In this case, the matching circuit includes a signal path electrically connected between the front end circuit and the planar antenna, and also a first and a second tunable impedance element. In this case, in step A), that frequency band is chosen in which the matching circuit is intended to bring about the impedance matching between front end circuit and planar antenna. Step B) constitutes an initialization, in which the initial impedances of the tunable impedance elements are set to predefined values that are dependent on the selected band. Step C) involves determining the actual impedance matching in the transmission frequency range of the selected band. On the basis of these values, step D) involves determining a new set of impedances to which the tunable impedance elements are set. Step E) then involves determining the impedance matching with the newly set impedance values of the tunable impedance elements. Steps D) and E) are then processed again successively in a loop (see step F)), whereby the impedance matching is iteratively and progressively improved. The method is conducted in such a way that simultaneous impedance matching of the transmission and reception frequency bands takes place. The method is simple and stable because, in each iteration loop, only the present impedance matching of the transmission frequency range serves as a basis for determining and setting new impedance values.

In one configuration, the impedance matching of the front end circuit and of the planar antenna is carried out simultaneously in transmission and reception frequency ranges. Thus in FDD operation, by way of example.

In one advantageous configuration of the matching circuit, a so-called ultra-wideband matching network is used, the bandwidth of which includes both the transmission and the reception frequency range of the chosen band.

In one even more advantageous configuration, the matching circuit used is an ultra-wideband matching network, the bandwidth of which includes the transmission and reception frequency ranges of a plurality of bands.

As an alternative to the matching circuit with an ultra-wideband matching network, it is also possible to use a matching network having two matching points at which the matching to transmission and reception frequency ranges is optimal.

In one advantageous configuration of the matching circuit used, the first tunable impedance element is electrically connected in the signal path. The second tunable impedance element is electrically connected between signal path and ground in a shunt path. Likewise in a parallel shunt branch, a first inductive element is electrically connected in parallel with the second tunable impedance element. It is preferred for the first inductive element to be electrically connected between antenna and ground. This is because ESD pulses introduced via the antenna can then be effectively dissipated to ground by the first inductive element, without the ESD pulses damaging other elements of the matching circuit or parts of the front end module. A second inductive element can be electrically connected between signal path input and ground. In one embodiment of this configuration, a third inductive element is electrically connected in series with the first tunable impedance element in the signal path.

The first, the second or both tunable impedance elements are preferably impedance elements having a variable, that is to say adjustable, capacitance and in each case include at least one connected component, selected from: an element that includes MEMS components, a CMOS element, an element including barium strontium titanate, an element including gallium arsenide, a capacitance matrix connected by means of field effect transistors, an NMOS element, a PMOS element, an element including SiGe, an element including graphene, and an element including carbon. In particular, capacitors electrically connected in a so-called array are appropriate as impedance elements having a variable capacitance, the capacitances of which capacitors can be electrically connected by switches individually or together to form a total capacitance.

As an alternative to tunable capacitive elements, however, it is also possible to use tunable inductive elements, the inductance of which can be set in a variable fashion.

A PILA (Planar Inverted L Antenna) or a PIFA (Planar Inverted F Antenna) is preferred as the planar antenna. Such antennas are not matched to a fixed impedance; their matching takes place dynamically by means of the matching circuit. It is thus possible to react to variable external influences. Other antennas, e.g., ILAs (Inverted L Antenna), IFAs (Inverted F Antenna) or rod antennas, can also be used, in principle. Furthermore, the antenna can include a so-called metamaterial. Metamaterials are materials which have properties that do not occur naturally, e.g., negative refractive indices, and are artificially synthesized.

In one preferred embodiment, the matching circuit is electrically connected to a microcontroller. The microcontroller can contain the logic circuits by means of which the new impedance values of the adjustable impedance elements are determined in step D). The output values of the initial impedances of the tunable impedance elements can also be stored in the microcontroller. For this purpose, the microcontroller is preferably electrically connected to a detector and the adjustable impedance elements. The detector is electrically connected in the signal path and serves for detecting the impedance matching between front end circuit and planar antenna.

In one embodiment, the matching circuit and/or the microcontroller is electrically connected to an application-specific integrated circuit. By means of such an ASIC (Application Specific Integrated Circuit), as it is called, it is possible to implement specific wishes of customers or requirements from customers in respect of an impedance matching circuit, without the interconnection of the impedance matching circuit having to be fundamentally changed.

It is preferred if the detector is electrically connected in the signal path and supplies a linear or logarithmic signal for the matching. Linear means that the signal is proportional to the absolute value of the phase or the power of a radio-frequency signal propagating between front end circuit and planar antenna. Logarithmic means that the signal is proportional to a logarithm of the absolute value of the phase or the power.

In steps C) and E), in which the impedance matching is determined, preferably the admittance, the voltage standing wave ratio (VSWR), the phase change or the reflection coefficient of propagating signals, or alternatively directly the impedance is determined and possibly communicated to the microcontroller. An impedance improvement is achieved if the voltage standing wave ratio or the reflection coefficient is reduced. The optimization process accordingly includes finding local, or better: global, maxima or minima. As an alternative, the phase of the impedance can also be regulated to zero.

It is furthermore preferred if during step D), alternately progressively firstly the value of one tunable impedance element is varied until a, local, optimum of the impedance matching is attained, before the value of another tunable impedance element, is varied until a further, now accessible, "better," optimum of the impedance matching is attained. Such a method is generally more stable or faster than methods in which a plurality of adjustable impedance elements are allocated a new impedance in one step.

The method experiences a further improvement in one particularly preferred configuration if the impedances Z1 and Z2 of both tunable impedance elements are related to one another by a defined relation. This feature leads to an improved stability and to an improved convergence of the method and is realized, for example, by the fact that a complex-valued function F of the two complex-valued impedance values Z1 and Z2 of the adjustable impedance elements is defined, the function value of which is always 0. Such a function can reduce the number of degrees of freedom because in each case the real and imaginary parts of Z1 and Z2 are no longer adjustable independent of one another, but rather are dependent on one another.

Such a preferred function is distinguished, for example, by the fact that its imaginary part corresponds to the sum of: imaginary part of Z2, A times the imaginary part of Z1 and B, wherein A and B are negative real numbers, and wherein the real part of the function F corresponds to the sum of the absolute values of the real parts of the impedances Z1 and Z2. This is tantamount to the statement that the real part of the impedances Z1 and Z2 is equal to 0 and that there is a linear dependence between the imaginary parts of Z1 and Z2.

In a further configuration, however, the imaginary part of the function F can also be a real-valued polynomial that is dependent on the sum of: powers of the imaginary part of Z1 and powers of the imaginary part of Z2. Thus, F can be, e.g., quadratically dependent on one or both imaginary parts.

Preferably, the imaginary part of one impedance of Z1 and Z2 is always greater than the imaginary part of the other impedance.

The convergence and the stability, as well as the matching in the transmission and reception frequency ranges, are furthermore improved if the ratio of the absolute values of the impedances lies in the interval 1.01 to 100. As an equivalent alternative thereto, the intervals 0.01 to 0.99 and 0.5 to 1.5 are also appropriate. Furthermore, the convergence can be improved if, in step D), the gradient of the impedance matching of the matching circuit is calculated in order to determine therefrom the impedances which are to be newly set.

For finding optimal matching, i.e., corresponding maxima or minima, variants of the Hooke-Jeeves method are appropriate. More complex methods such as the conjugate gradient method, for example, may also be advantageous if convergence with the fewest possible steps is striven for. Further appropriate methods concern the Newton method, the interval halving method or the golden section method. In particular, for each band or for each antenna geometry, it is possible to use a different method for optimizing the impedance matching.

The band-dependent initial impedances for different frequency ranges are preferably stored in a so-called look-up table (table for standard values).

Specifically for a matching circuit in a multiband communication device it is preferred if the communication is not restricted to an initially chosen band, but rather if the frequency band can be changed during operation. For this purpose, it is preferred if step E2)—selecting a new band and continuing with step B) is inserted between steps E) and F).

Furthermore, it is advantageous if step E3) remaining in a waiting state until a defined action occurs, is inserted between steps E) and F).

The matching circuit is preferably integrated in a mobile communication device.

The defined action mentioned above is intended to include, in particular, the following actions:
the detection of a signal of an application-specific integrated circuit,
a change in the position of the housing into which the matching circuit is integrated, the change being reported by a position control,
a change in the power consumption,
a synchronization,
a change in the transmission/reception frequency band, or
a change reported by a mechanics sensor.

As already mentioned in the introduction, a planar antenna changes its impedance as a reaction to external changes. In particular, the change in the position of the housing is a change which requires new antenna impedance matching. If a change in the power consumption is ascertained, for example, then this generally is also an indication that the front end circuit is no longer well matched to the antenna. A synchronization carried out for calibration purposes, for example, may also necessitate new matching of the impedance. In general, the change in the transmission and/or reception frequency band or, alternatively thereto, the change in the transmission and/or reception frequency channel also requires new matching of the impedance between front end circuit and antenna since optimal impedance matching is generally frequency-dependent. A change reported by a mechanical sensor may be, in particular, the message regarding the flipping back or sliding back of a cover (for example, display or camera cover) since such a change may also necessitate new impedance matching.

If the RF power in the transmission frequency range lies below a critical power, then it is possible that the impedance matching may not be measured successfully to a sufficient extent. It is then advantageous if a dynamic impedance matching, which consumes electrical energy, is suspended in order to save energy. The impedance measurement can also be suspended if a specific signal, e.g., from an ASIC, for transition to the waiting state is obtained.

The frequencies of the GSM (Global System for Mobile Communication) system, of the WCDMA (Wide Code Division Multiple Access) system and more generally the frequencies of FDD systems are the preferred frequencies at which the matching circuit can be used.

The following frequency pairs are particularly preferred:
transmission frequency range: 1920-1980 MHz and reception frequency range: 2110-2170 MHz,
transmission frequency range: 1850-1910 MHz and reception frequency range: 1930-1990 MHz,
transmission frequency range: 1710-1785 MHz and reception frequency range: 1805-1880 MHz,
transmission frequency range: 1710-1755 MHz and reception frequency range: 2110-2155 MHz,
transmission frequency range: 824-849 MHz and reception frequency range: 869-894 MHz,
transmission frequency range: 830-840 MHz and reception frequency range: 875-885 MHz,
transmission frequency range: 2500-2570 MHz and reception frequency range: 2620-2690 MHz,
transmission frequency range: 880-915 MHz and reception frequency range: 925-960 MHz,
transmission frequency range: 1750-1785 MHz and reception frequency range: 1845-1880 MHz,
transmission frequency range: 1710-1770 MHz and reception frequency range: 2110-2170 MHz,
transmission frequency range: 1428-1453 MHz and reception frequency range: 1476-1501 MHz,
transmission frequency range: 698-716 MHz and reception frequency range: 728-746 MHz.

One particularly preferred configuration of the method is based on the fact that between step A) and B), in a step A2), a set of permissible impedance values for each tunable impedance element is defined for each tunable impedance element depending on the chosen band. These initialization values can be stored in look-up tables.

The combined impedance matching for transmission and reception frequency ranges can be considerably improved by virtue of the fact that between step A) and step B), in a step A3), for each tunable impedance element depending on the chosen band, a lower limit value of the real part of the impedance, which is not undershot in steps B) and D), and an upper limit value of the real part of the impedance, which is not exceeded in steps B) and D), and a lower limit value of the imaginary part of the impedance, which is not undershot in steps B) and D), and an upper limit value of the imaginary part of the impedance, which is not exceeded in steps B) and D), are defined. The impedance matching is based merely on the knowledge of the impedance matching of the transmission frequency range, e.g., because the impedance matching of the reception frequency range cannot be determined straightforwardly. This is desirable since, if it is merely necessary to take account of the matching in the transmission frequency range, convergence can be achieved more rapidly and more stably than if the matching in the reception frequency range additionally had to be taken into account. This also means, however, that the optimization in the transmission frequency range would be carried out independently of and possibly at the expense of the matching in the reception frequency range. Such optimization might result in the immediate termination of the call if the connection in the reception frequency range is interrupted. The restriction of the impedance range of the first and second impedance elements that is available for the optimization process to selected ranges, which may be dependent on the frequency band and on the antenna geometry, prevents the connection quality in the reception frequency range from falling below a lower measure. The impedance matching in the transmission frequency range is therefore optimized, while a significant impairment in the reception frequency range does not take place.

The sets of permissible impedance values can be determined, e.g., in the laboratory under controlled conditions. The conditions that can be set in the laboratory can simulate various real situations which necessitate impedance matching. It is also possible for corresponding permissible impedance values to be determined in order to cover different circuit combinations or antenna circuits. The values determined can be stored in microcontrollers, in ASICs or in the RF chipset.

One important requirement made of systems for adaptive impedance measurement which are provided for operation in (frequency division) duplex operation standards (FDD) is, of course, that of being compatible with time-division-duplexed systems (TDD). During a telephone call, a TDD system transmits and receives the data virtually simultaneously. The user does not notice the division into time slots at all.

The invention therefore furthermore includes methods for controlling the matching in TDD systems and is thus compatible with TDD transmission systems: for the impedance matching of the front end circuit and of the planar antenna in TDD operation, during steps D), for the transmission frequency range, the new impedances of the tunable impedance elements are optimized towards the respective transmission frequency range. During steps E), the impedance matching of the matching circuit is determined during the transmission operating time slots.

In TDD operation, it is not absolutely necessary for the impedance matching to be optimal in that time slot which is currently inactive. Therefore, during TDD operation, the invention enables optimal impedance matching, for example, during the transmission operating time slot. For impedance matching optimized towards the respective reception frequency range can be effected separately for the reception operating time slot.

In one embodiment, during steps D) the new impedances of the tunable impedance elements are determined for the reception frequency range in a manner dependent on the impedances determined for the transmission frequency range. That is advantageous because it is then not necessary to determine the matching during reception and a setting with good matching nevertheless exists and is found.

The corresponding concrete dependence can furthermore take into account the interconnection of the impedance matching circuit, the concrete configuration of the (planar) antenna and the different transmission and reception frequency ranges. The corresponding dependencies can be stored in a logic unit, e.g., in the form of a look-up table.

In one configuration, the first tunable impedance element is electrically connected in the signal path, and the second tunable impedance element is electrically connected between signal path and ground. The new impedances of the first tunable impedance element for the reception frequency range are identical to those of the transmission frequency range. The new impedances of the second tunable impedance element for the reception frequency range result from those of the transmission frequency range by subtraction of fixedly defined impedances.

The first and the second impedance elements can assume, for example, 32 equidistant values of the impedance. If i, starting with 0, designates the number of the value of the impedance, ordered according to the magnitude, of the first tunable impedance element and j, starting with 0, designates the number (with respect to a number of values ordered according to the magnitude) of the value of the impedance of the second tunable impedance element for the case where the impedance matching is optimized towards the transmission frequency range, then the values of the impedance of the second impedance element for the reception frequency range result as follows:

If $i \leq 1$, then: impedance of the second impedance element during the reception operating time slot=(j−10)-th value of the second impedance element during the transmission operating time slot; but at least: 0-th value.

If i=2, then: impedance of the second impedance element during the reception operating time slot=(j−10)-th value of the second impedance element during the transmission operating time slot; but at least: 0-th value.

If i=3, then: impedance of the second impedance element during the reception operating time slot=(j−8)-th value of the second impedance element during the transmission operating time slot; but at least: 0-th value.

If i=4, then: impedance of the second impedance element during the reception operating time slot=(j−5)-th value of the second impedance element during the transmission operating time slot; but at least: 0-th value.

If i=5, then: impedance of the second impedance element during the reception operating time slot=(j−2)-th value of the second impedance element during the transmission operating time slot; but at least: 0-th value.

If i=6, then: impedance of the second impedance element during the reception operating time slot=(j−1)-th value of the second impedance element during the transmission operating time slot; but at least: 0-th value.

If i>6, then: impedance of the second impedance element during the reception operating time slot=(j)-th value of the second impedance element during the transmission operating time slot.

The value of the first impedance element in the reception frequency band corresponds to the value of the first impedance element in the transmission frequency band.

These values also apply to adaptive impedance elements, the impedance of which can be changed continuously, although then for a set of equidistant values within the adjustable interval.

These values apply to the GSM 850 system (transmission frequency range: 824-849 MHz; reception frequency range: 869-894 MHz). For other frequency ranges, other differences should be chosen accordingly.

Method steps D) and E) for impedance matching proceed, in TDD operation, in parallel with the transmission and reception operating time slots or the changeover thereof. Both processes can proceed independently of one another. However, both processes can also be synchronized in order, by way of example, to ensure that new impedances are set directly during the Tx/Rx changeover.

The embodiments mentioned above describe methods for operating a matching circuit which can operate both in FDD and in TDD systems. These methods work rapidly and are simple and therefore very robust, and they lead to good impedance matching in both systems and for transmission and reception frequency ranges.

The invention furthermore includes the matching circuit together with control which achieves the simultaneous impedance matching of the front end circuit to the planar antenna both in transmission and in reception frequency ranges of selected bands.

BRIEF DESCRIPTION OF THE DRAWINGS

A method for impedance matching and also a matching circuit are explained in greater detail below on the basis of exemplary embodiments and with reference to associated schematic figures, in which.

The following list of reference symbols may be used in conjunction with the drawings:

An: Antenna
ASIC: Application-specific integrated circuit
AS: Matching circuit
DET: Detector
FES: Front end circuit
G: Housing
ImpE1, ImpE2: First, second tunable impedance element
In1, In2: First, second inductive element
MC: Microcontroller
Min: Local minimum of the voltage standing wave ratio
MK: Mobile communication device
PLA: Planar antenna
VSWR, VSWR': Frequency-dependent voltage standing wave ratio
SP: Signal path

DETAILED DESCRIPTION OF ILLUSTRATIVE EMBODIMENTS

Figure 1:
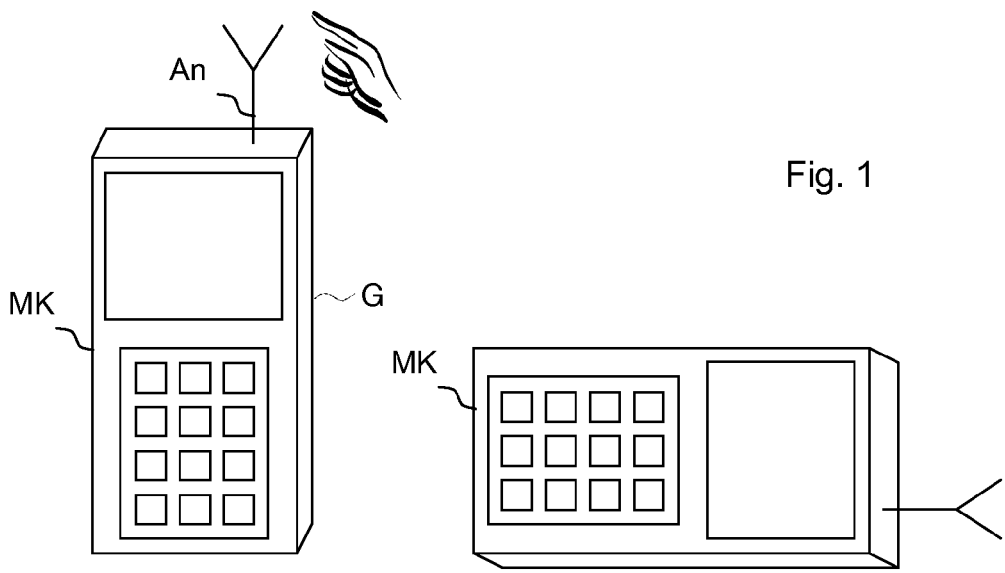
FIG. 1 symbolically shows the interaction between a user and a portable communication device.

FIG. 1 illustrates possible causes which necessitate dynamic impedance matching. A mobile communication device MK includes an antenna An. On the left in FIG. 1, a hand held in the vicinity of the communication device symbolizes a user interaction which changes the impedance value of an antenna. Such changes occur, for example, if a user holds the communication device nearer or further away from the ear or changes the distance between his hand and the communication device. Furthermore, new matching of the impedance is necessary when the device is shifted from an upright position (on the left in FIG. 1) to a horizontal position (on the right in FIG. 1), or vice versa, that is to say when the spatial orientation of the communication device in the surroundings thereof changes, or when, for example, the communication device is placed onto a table surface. The illustration of the antenna in FIG. 1 is only schematic. Planar antennas, in particular, are often incorporated on the rear side of the communication device within the housing G and are therefore not visible externally.

Figure 2:
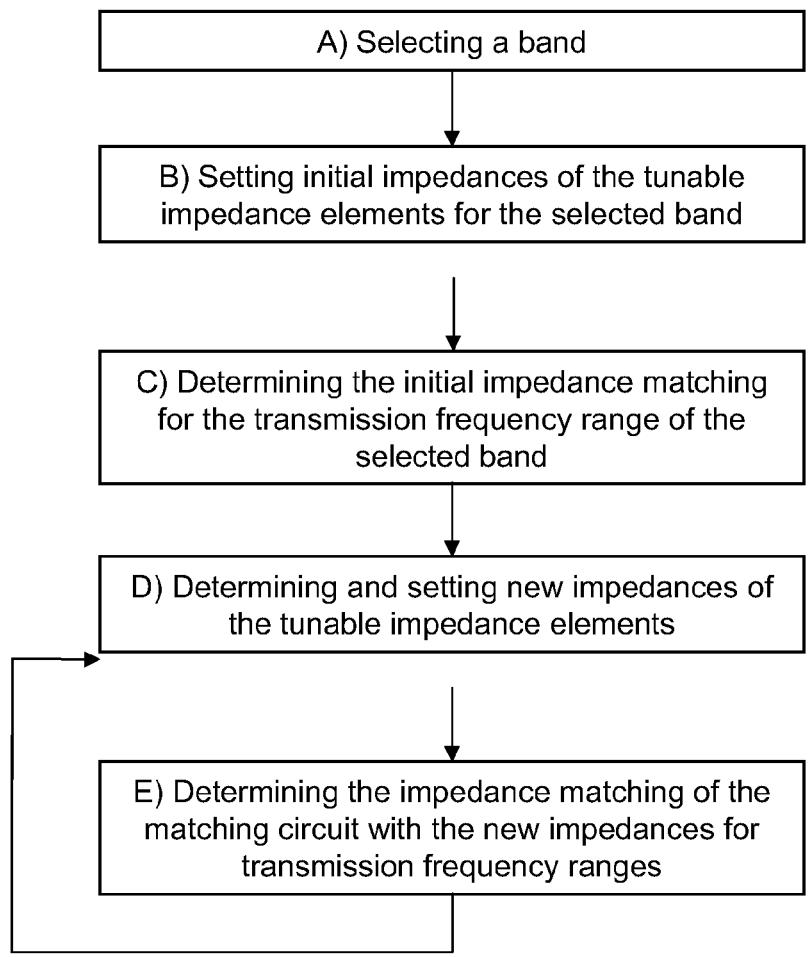
FIG. 2 shows the temporal sequence of steps A), B), C), D) and E)

FIG. 2 shows the basic form of the method for impedance matching, including steps A) to E), wherein firstly steps A) to E) are processed in the order shown, and then steps D) and E) are continuously repeated in a loop. The actual loop therefore includes the steps of:

D) determining and setting new impedances of the tunable impedance elements, and E) determining the impedance matching of the matching circuit with the new impedances for transmission frequency ranges.

Figure 3A:
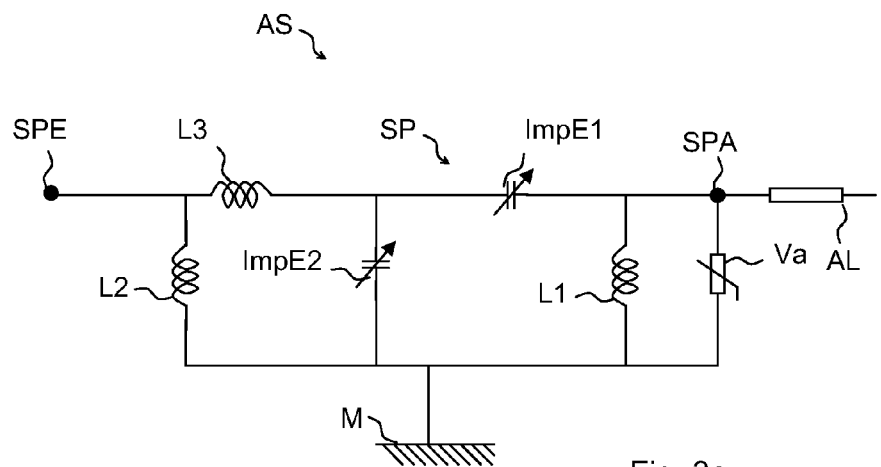
FIG. 3*a* shows a configuration of the matching circuit.

FIG. 3*a* illustrates a matching circuit AS, which enables wideband impedance matching simultaneously of both the transmission frequency range and of the reception frequency range. Between a signal path input SPE and a signal path output SPA, a first impedance element having an adjustable impedance ImpE1 is electrically connected in a signal path SP. A second impedance element having an adjustable impedance ImpE2 is electrically connected between signal path SP and ground M, here between the signal path input SPE and ground M. A first inductive element L1 is electrically connected between signal path output SPA and ground M. Furthermore, a second inductive element L2 is electrically connected between signal path input SPE and ground M. Furthermore, an element having a voltage-dependent resistance Va is electrically connected between signal path output SPA and ground M. Harmful interference signals, such as ESD pulses, for example, which might penetrate into the matching circuit via an antenna lead AL, to which the antenna is connected, can be dissipated to ground M via the second inductive element L2 or via the element having a variable voltage-dependent resistance Va. FIG. 3*a* shows, moreover, an embodiment in which, in the signal path SP, a third inductive element L3 is electrically connected between the signal path input SPE and the first impedance element ImpE1. The interconnection of the inductive elements can be more or less advantageous depending on the frequency range and antenna geometry. Accordingly, it is possible to connect up only one, only two or three impedance elements.

Steps D) and E) involve progressively determining the impedance matching in the signal path and correspondingly varying the impedance values of the adjustable impedance ImpE1 and ImpE2. FIG. 3*a* shows the impedance elements by way of example as adjustable capacitive elements. As an alternative, adjustable inductive elements can also be electrically connected. It is also possible for a combination of adjustable capacitive elements and adjustable inductive elements to be electrically connected.

Figure 3B:
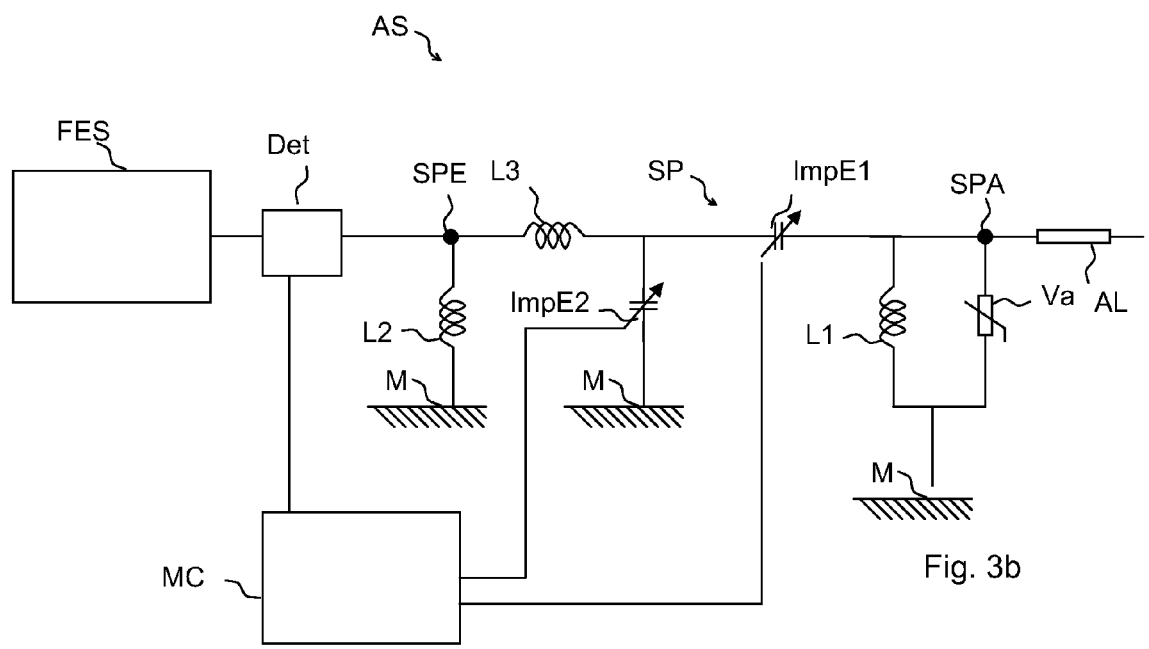
FIG. 3*b* shows a configuration of the matching circuit in the circuit environment thereof.

FIG. 3*b* illustrates the schematic interconnection of the matching circuit AS with further components of a mobile communication device MK. A detector Det is electrically connected in series between the front end circuit FES and the signal path input SPE of the matching circuit and is provided for detecting the impedance matching. For this purpose, a signal which is dependent linearly or logarithmically on the absolute value of the phase or the power that is transmitted by the signal path is determined. A microcontroller MC is electrically connected to the detector DET and the first and second impedance elements having a variable impedance ImpE2 and ImpE1. Integrated in the microcontroller is the logic which determines a new set of impedance values on the basis of the instantaneous impedance matching and correspondingly sets the adjustable impedance elements.

Figure 4A:
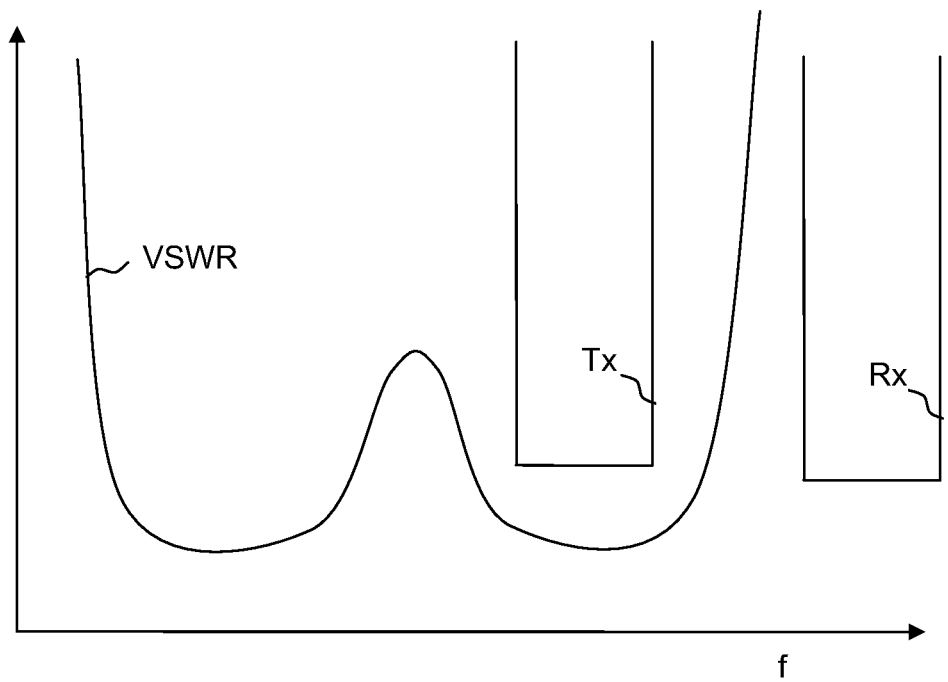
FIG. 4*a* shows the profile of the voltage standing wave ratio in the case of a matched transmission frequency range.

FIG. 4*a* illustrates a general problem which can occur if only the impedance matching in the transmission frequency range is taken as a basis for impedance matching. The profile of the frequency-dependent voltage standing wave ratio VSWR, which is intended to serve as an information source for the present impedance matching, is shown here by way of example. The frequency f increases towards the right in the illustration shown. The matching circuit present is a matching network having two matching points at which the matching to possible transmission and reception frequency ranges is optimal. The impedance matching is implemented here in such a way that the matching for the transmission frequency band, represented by the range marked with Tx, has a local optimum. However, the matching circuit is not set optimally here for the reception frequency range, represented by the range marked with Rx. A microcontroller cannot deduce the matching of the reception range solely on the information basis of the matching of the transmission frequency range.

Figure 4B:
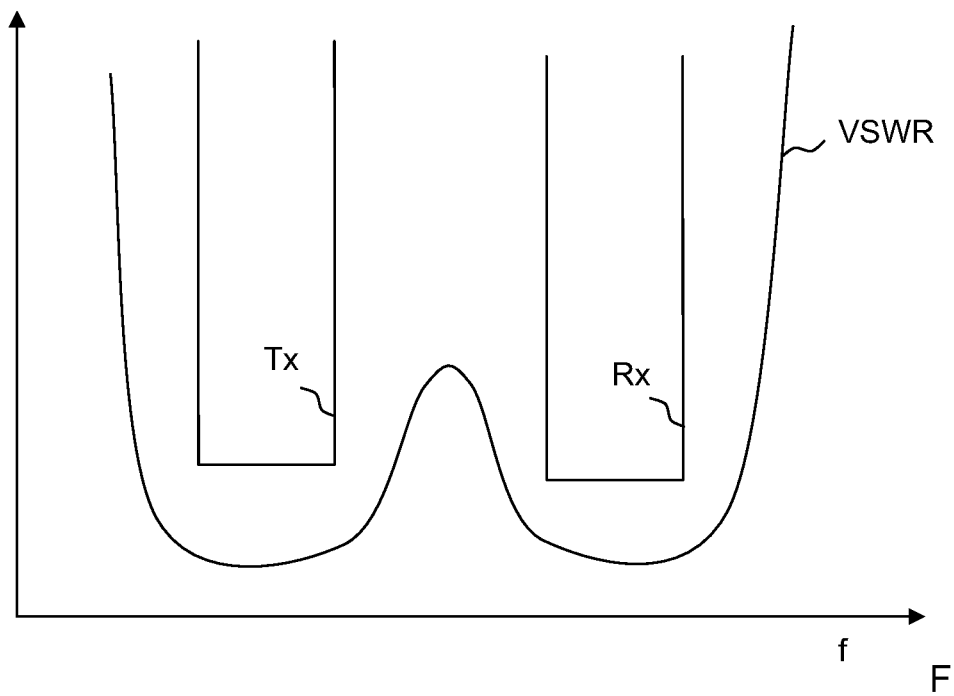
FIG. 4*b* shows the profile of the voltage standing wave ratio in the case of matched transmission and reception frequency ranges.

FIG. 4b shows an analogous case, but where the matching network comprising two matching points is set in such a way that the two matching points respectively correspond to the frequency ranges of the transmission band Tx and of the reception band Rx. In contrast to the situation in FIG. 4a, a call, that is to say simultaneous transmission and reception operation, can take place because the impedance matching in the transmission and reception frequency ranges is sufficiently good.

Figure 5A:
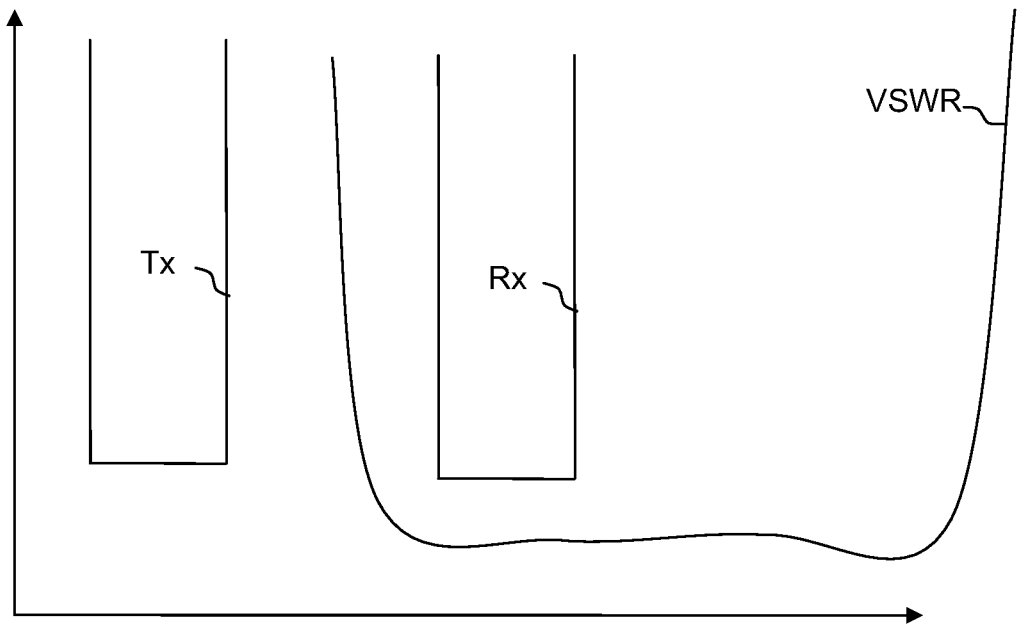
FIG. 5*a* shows the profile of the voltage standing wave ratio in the case of a matched reception frequency range.

FIG. 5a demonstrates the situation with an ultra-wideband matching circuit, wherein the front end is matched to the antenna only with regard to the reception frequency range Rx. The impedance in the transmission frequency range Tx is not matched and so simultaneous communication cannot take place here either.

Figure 5B:
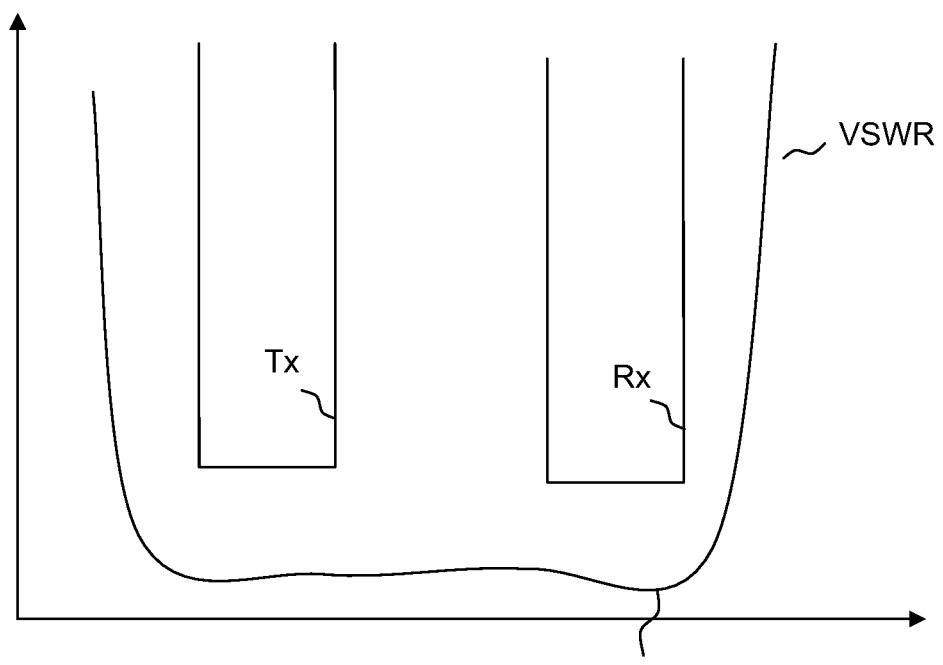
FIG. 5*b* shows the profile of the voltage standing wave ratio in the case of simultaneously matched transmission and reception frequency ranges.

The difference with respect to FIG. 4a, however, is that here the transmission frequency range is not matched. Optimal matching can take place in an optimization solely with regard to the transmission frequency range. During the optimization process, the variable impedance elements are allocated progressively improved impedance values, the new impedance matching, that is to say the new voltage standing wave ratio, being used as a measure of the quality of new impedance values. After a few optimization steps, the system is subsequently in the state illustrated in FIG. 5b, in which the transmission frequency range Tx and reception frequency range Rx are both optimally matched. There is a risk here, however, of the reception frequency range losing its good matching if the matching method performs the matching in such a way that the local minimum min of the voltage standing wave ratio but is situated at the right-hand edge is shifted towards the transmission frequency range.

Figure 6:
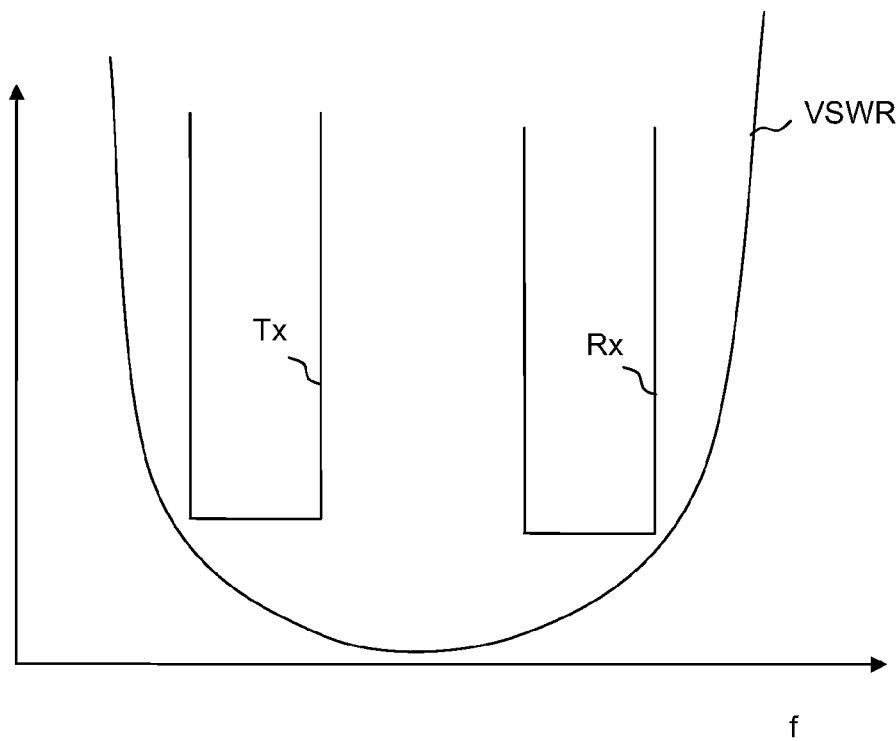
FIG. 6 shows the profile of the voltage standing wave ratio in the case of simultaneously matched transmission and reception frequency ranges.

FIG. 6 illustrates the situation in which either the two matching points of a matching network coincide or in which one of the two matching points is so far away from the relevant frequency range that it cannot be reached by a reasonable number of optimization steps. This situation is distinguished by the fact that the optimized settings of the variable impedance elements have to result in the impedance matching in both frequency ranges. If, by contrast, only the impedance matching with regard to the transmission frequency range Tx is optimized, this inevitably has the effect that reception signals in a reception frequency range Rx, on account of an excessively high reflection R of the impedance matching circuit, are no longer forwarded from the antenna to the front end circuit, but rather are reflected back into the antenna. A call would be interrupted as a consequence of this.

Figure 7:
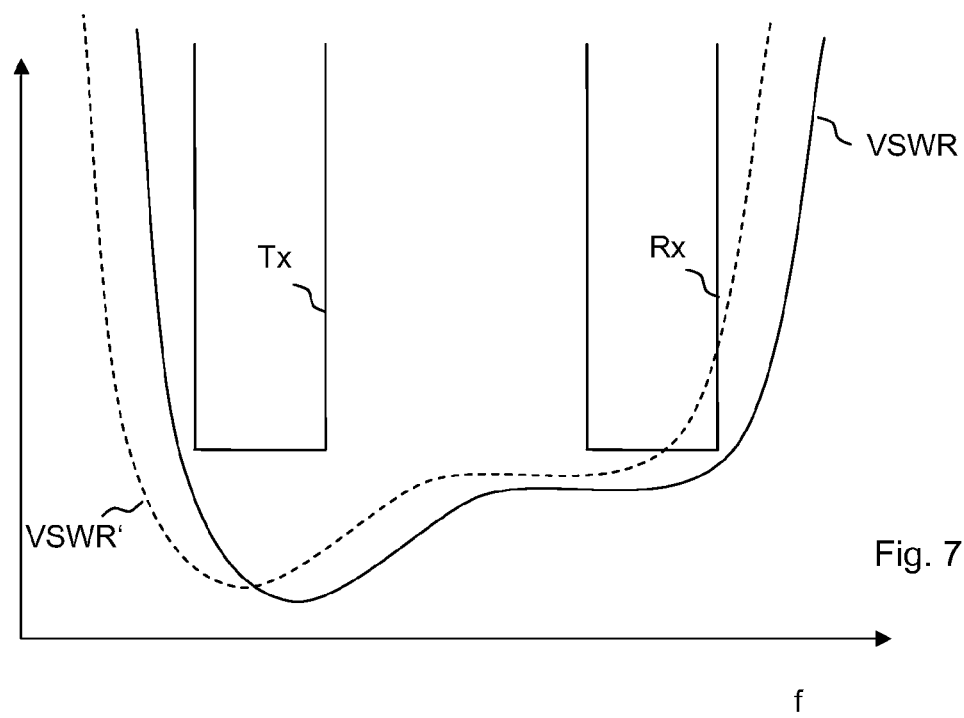
FIG. 7 shows different profiles of voltage standing wave ratios in the case of transmission and reception frequency ranges matched with different qualities of matching.

A similar situation is illustrated by way of example in FIG. 7. If the system is in a state, for example, which is characterized by the voltage standing wave ratio VSWR, that is to say by the solid line, then transmission Tx and reception Rx frequency ranges both together are sufficiently matched. However, since the transmission frequency range as considered by itself is not yet optimally matched, a further optimization with regard to the transmission frequency range Tx (which is characterized by the state VSWR'—the dashed line) would have the effect that the reception frequency range Rx is no longer sufficiently matched. The reception of reception signals might then be disturbed.

What is proposed as a very simple, robust and rapid solution to this problem is a configuration of the method in which the range of values of the permitted impedance elements within the possibly larger range of impedance elements which are adjustable in principle is restricted such that, in the optimization process for the transmission frequency range, it is possible to avoid an impairment in the reception frequency range below a critical limit. In this case, the restrictions to which the individual impedance elements are intended to be subjected during the optimization can be chosen in varying fashion from antenna geometry to antenna geometry and from frequency band to frequency band.

Figure 8:
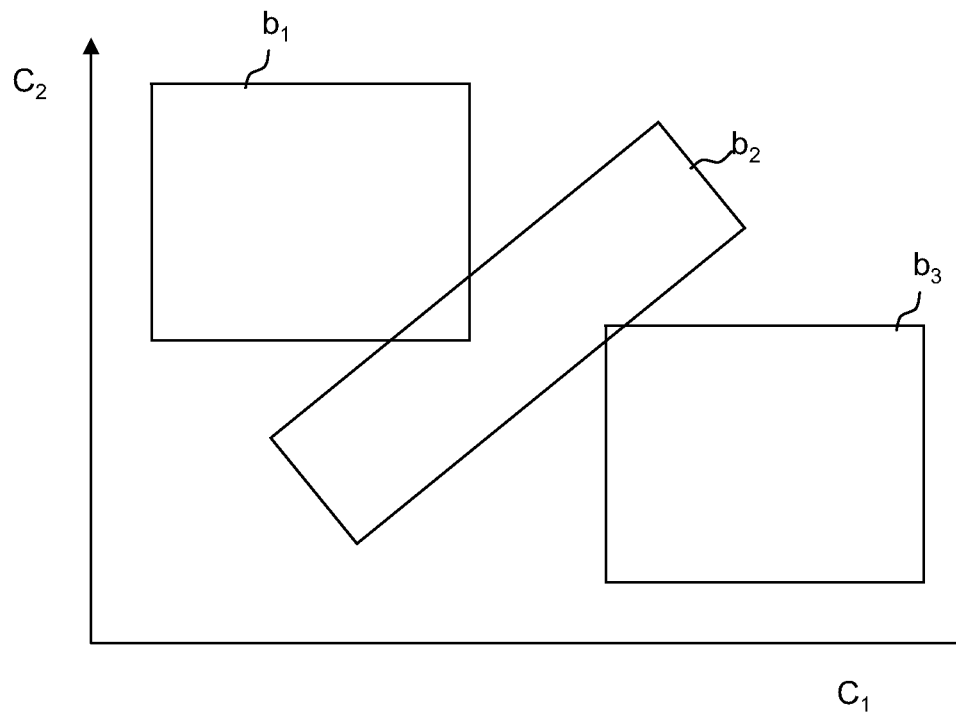
FIG. 8 shows examples of restricted ranges of values of the impedances of the adjustable impedance elements.

FIG. 8 illustrates by way of example the situation in which the two impedance elements are adjustable capacitive elements whose capacitance can be varied. In this case, C1 designates, for example, the capacitance of the first impedance element, while C2 designates the capacitance of the second impedance element. Three restricted ranges b1, b2, b3 of concrete permitted value pairs C1/C2 with which the optimization process can be carried out are specified here by way of example. The range b1 is distinguished by the fact that in it the capacitance of the second impedance element is always greater than that of the first, while in the range b3 the capacitance of the first impedance element is always greater than that of the second impedance element. The range b2 is distinguished by the fact that the capacitances of the first and second impedance elements are substantially equal in magnitude and that this magnitude is in each case varied during the optimization steps.

By way of example, the following combinations of capacitance ranges for C1 and C2 are advantageous:

0.6 pF<=C1<=11 pF and 0.6 pF<=C2<=11 pF, or
0.5 pF<=C1<=5 pF and 0.5 pF<=C2<=5 pF, or
4 pF<=C1<=6 pF and 0.8 pF<=C2<=2 pF, or
8 pF<=C1<=10 pF and 1.5 pF<=C2<=2.5 pF, or
7 pF<=C1<=12 pF and 2 pF<=C2<=4 pF, or
4 pF<=C1<=12 pF and 0.8 pF<=C2<=4 pF, or
8 pF<=C1<=12 pF and 2 pF<=C2<=4 pF, or
0.5 pF<=C1<=3.4 pF and 1 pF<=C2<=6.4 pF, or
0.5 pF<=C1<=3.4 pF and 0.5 pF<=C2<=3.4 pF, or
1 pF<=C1<=6.2 pF and 1 pF<=C2<=6.2 pF.

Figure 9:
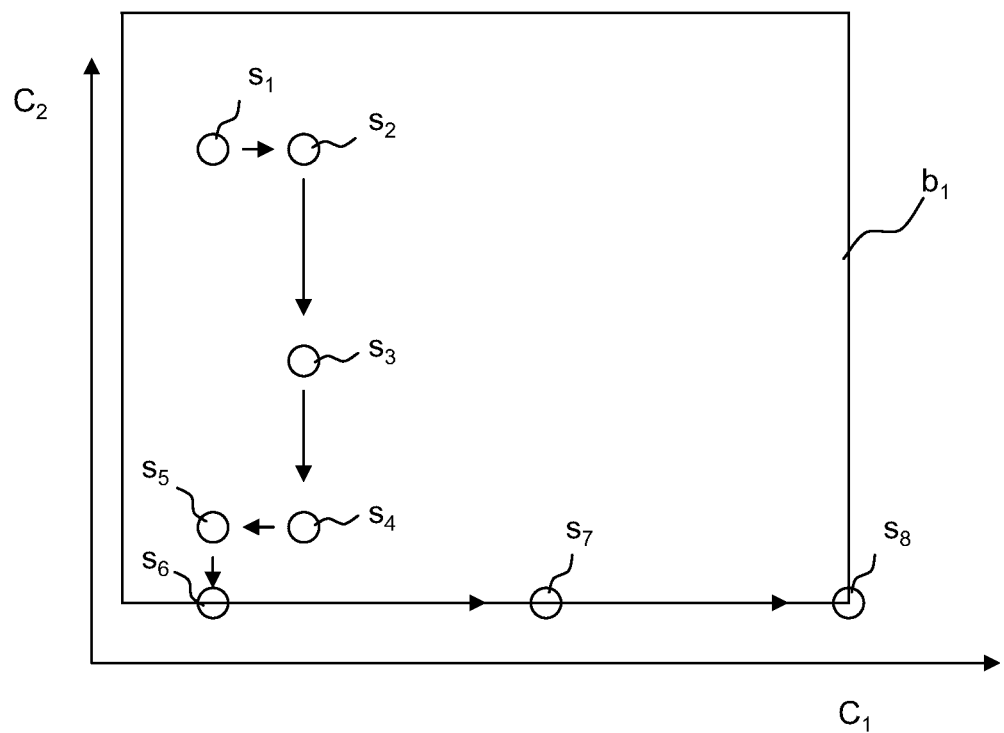
FIG. 9 shows the step-by-step progression of an optimization process.

FIG. 9 schematically illustrates a possible progression of an optimization process. In this case, each of the states s1 to s8 passed through in this case is characterized by the two concrete capacitance values of the two impedance elements. The starting point s1 is a state of high capacitance of the second element and low capacitance of the first element. In a first optimization step, the state s2 is reached, which differs from the state s1 in that the capacitance of the first element is increased. In order to keep the optimization method simple and stable, preferably firstly only one parameter is changed until an optimum of the matching is reached with regard to this value. Only afterwards is the other parameter changed until a further optimum of the matching is reached with regard to this value.

In the example of FIG. 9, a first optimum of the matching is reached in the state s2 since a further change in the capacitance of the first element does not provide a further improvement of the matching. Therefore, in the further two optimization steps leading to the state s4, the capacitance of the second element is reduced until, in turn, no further improvement occurs in this case either.

In the next optimization step, from the state s4 to the stage s5, the impedance matching is improved by the capacitance of the first impedance element being reduced again. Thereafter, the capacitance of the second impedance element is reduced and, in the last two method steps leading to the state s8, the capacitance of the first element is once again increased. In the sixth, seventh and eighth states, the limit of the permitted range b1 has already been reached. A further reduction of the capacitance of the second element is not permitted since the impedance matching of the reception frequency range might otherwise be impaired. In the state s8, the upper limit of the first capacitance element is also reached. A further optimization, which would entail increasing the capacitance of the first element or decreasing the capacitance of the second element, is not permitted. A further improvement of the impedance matching no longer takes place until a changed antenna impedance requires renewed matching.

This example is characterized in that the impedance of only one impedance element in each case is changed. In order to achieve an improved convergence, however, it may also be advantageous for both impedance elements to be newly set simultaneously in one step. If both impedance elements were adjustable capacitive elements, then in FIG. 9, for example, steps in any desired directions would be possible as long as they remained within the permitted range.

Figure 10:
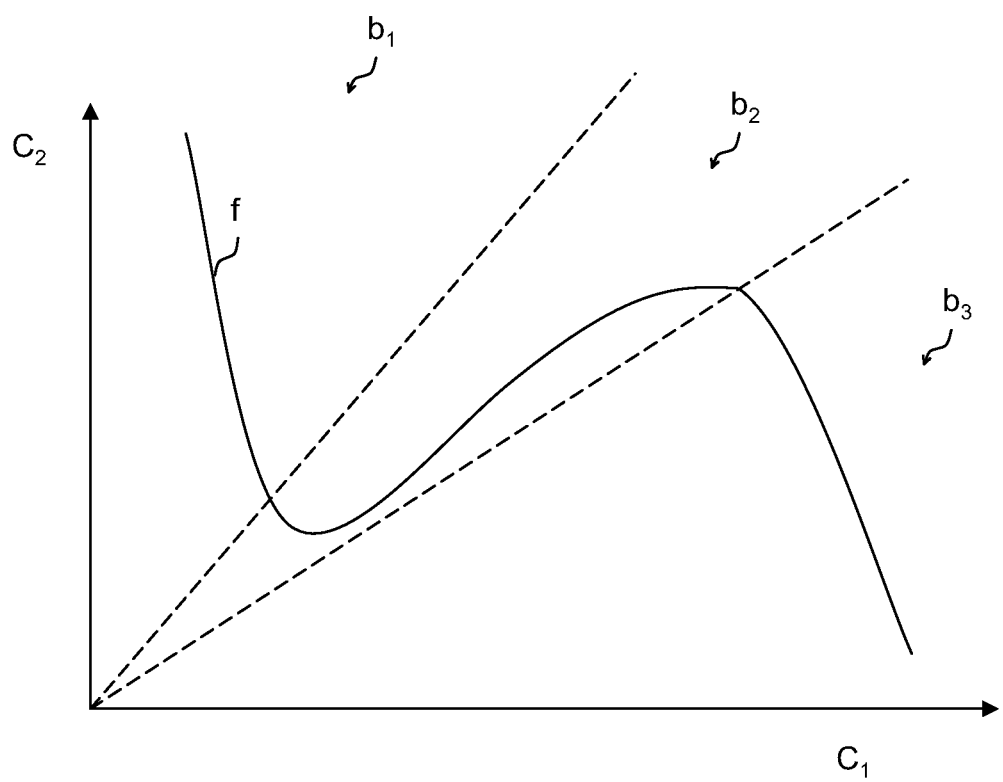
FIG. 10 shows ranges with linear dependence of the impedances.

FIG. 10 illustrates a situation in which the convergence is accelerated by the fact that specific relations existing between the capacitance values of the adjustable capacitances, preferably linear dependences, are utilized for the simultaneous optimization of both impedance elements. In the range b1, for example, which is distinguished by the fact that the capacitance value of the second capacitive element is always greater than that of the first capacitive element, there is a substantially linear relationship between optimal concrete capacitance values. The same function F that specifies the relationship existing or found between the impedances of the impedance elements may be valid for different frequency ranges and/or for different antenna geometries. However, a dedicated function that links two optimum impedance values to one another may also be valid for each frequency range or each antenna geometry.

A method according to the invention or an impedance matching circuit according to the invention is not restricted to one of the exemplary embodiments described. Combinations of these and other variations, which may include even further method steps or circuit elements, for example, likewise constitute exemplary embodiments according to the invention.

What is claimed is:

1. A method for matching impedances of a front end circuit and of a planar antenna in transmission and reception frequency ranges of selectable bands by a matching circuit that is electrically connected in a signal path between the front end circuit and the planar antenna and comprises a first tunable impedance element and a second tunable impedance element, the method comprising the steps of:
A) selecting a band,
B) setting initial impedances of the first and second tunable impedance elements for the selected band,
C) determining an initial impedance matching of the matching circuit for the transmission frequency ranges of the selected bands,
D) determining and setting new impedances of the first and second tunable impedance elements,
E) determining a new impedance matching of the matching circuit with the new impedances for the transmission frequency ranges, and
F) repeating step D until simultaneous matching of impedances of the front end circuit and of the planar antenna in transmission and reception frequency ranges of selected bands is obtained;
wherein impedances Z1, Z2 of the first and second tunable impedance elements are implicitly defined by an equation $f(Z1, Z2)=0$, wherein f is a complex-valued function of two complex-valued impedances Z1 and Z2.

2. The method according to claim 1, wherein the matching of the impedances of the front end circuit and of the planar antenna is carried out simultaneously in the transmission and reception frequency ranges.

3. The method according to claim 1, wherein the matching circuit comprises an ultra-wideband matching network having a bandwidth spanning the transmission and reception frequency ranges of the selected band.

4. The method according to claim 1, wherein the matching circuit comprises an ultra-wideband matching network having a bandwidth spanning the transmission and reception frequency ranges of a plurality of bands.

5. The method according to claim 1, wherein the matching circuit comprises a matching network having two matching points at which a matching to the transmission and reception frequency ranges is optimal.

6. The method according to claim 1, wherein
the first tunable impedance element is electrically connected in the signal path,
the second tunable impedance element is electrically connected between the signal path and ground,
between the signal path and ground, a first inductive element is electrically connected in parallel with the second tunable impedance element, and
between the signal path and ground, a second inductive element is electrically connected in parallel with the second tunable impedance element.

7. The method according to claim 1, wherein the first or the second tunable impedance element comprises an impedance element having a variable capacitance and comprises one or a plurality of connected components, selected from: an element comprising MEMS components, a CMOS element, an element comprising barium strontium titanate, an element comprising gallium arsenide, a capacitance matrix connected by field effect transistors, an NMOS element, a PMOS element, an element comprising SiGe, an element comprising graphene, an element comprising carbon, and/or a hyperabruptly doped element.

8. The method according to claim 1, wherein the first or the second tunable impedance element comprises a tunable inductive element.

9. The method according to claim 1, wherein the planar antenna comprises a PILA or a PIFA, or wherein the planar antenna comprises a metamaterial.

10. The method according to claim 1, wherein the matching circuit is electrically connected to a microcontroller.

11. The method according to claim 1, wherein the matching circuit is electrically connected to an application-specific integrated circuit.

12. The method according to claim 1, wherein the signal path is coupled to a detector for detecting a linear or logarithmic signal proportional to an absolute value, phase or power of a radio-frequency signal propagating between the front end circuit and the planar antenna.

13. The method according to claim 1, wherein, in steps C) and E), the impedance matching is determined by evaluating an impedance, an admittance, a voltage standing wave ratio, a phase change or a reflection coefficient of the matching circuit.

14. The method according to claim 1, wherein, during step D), firstly a value of the first tunable impedance element is varied until an optimum of the initial impedance matching is attained, before a value of the second tunable impedance element, is varied until a further optimum of the initial impedance matching is attained.

15. The method according to claim 1, wherein, $$\mathrm{Im}(f(Z1,Z2))=\mathrm{Im}(Z1)-a*\mathrm{Im}(Z2)-b$$

and $$\mathrm{Re}(f(Z1,Z2))=\mathrm{abs}(\mathrm{Re}(Z1))+\mathrm{abs}(\mathrm{Re}(Z2)), \text{ wherein}$$

a and b are real numbers,
Re is the real part of a complex-valued impedance,
Im is the imaginary part of the complex-valued impedance, and
abs is an absolute value function.

16. The method according to claim 1, wherein, $$\mathrm{Im}(f(Z1,Z2))=\text{a real-valued polynomial in Im}(Z1) \text{ and } \mathrm{Im}(Z2) \text{ of the degree}>=2 \text{ and}$$

$$\mathrm{Re}(f(Z1,Z2))=\mathrm{abs}(\mathrm{Re}(Z1))+\mathrm{abs}(\mathrm{Re}(Z2)),$$

wherein Re is the real part of a complex-valued impedance,
Im is the imaginary part of the complex-valued impedance, and
abs is an absolute value function.

17. The method according to claim 1, wherein Im (Z1)>Im (Z2), wherein Im is the imaginary part of the complex-valued impedance.

18. The method according to claim 1, wherein the ratio abs (Z2)/abs (Z1) of the absolute values of the impedances is an element of the interval [1.01 . . . 100].

19. The method according to claim 1, wherein the ratio abs (Z2)/abs (Z1) of the absolute values of the impedances is an element of the interval [1.01 . . . 0.99].

20. The method according to claim 1, wherein the ratio abs (Z2)/abs (Z1) of the absolute values of the impedances is an element of the interval [0.5 . . . 1.5].

21. The method according to claim 1, wherein, in step D), a gradient of an impedance of the matching circuit is calculated and the new impedances are determined therefrom.

22. The method according to claim 1, wherein the initial impedances for different frequency ranges are stored in a look-up table.

23. The method according to claim 1, further comprising:
E2) selecting a new band and continuing with step B),
the step E2) being performed between steps E and F.

24. The method according to claim 1, further comprising the step of:
E3) remaining in a waiting state until a defined action occurs,
the step E3) being performed between steps E and F.

25. The method according to claim 1, wherein the matching circuit is integrated into a mobile communication device.

26. The method according to claim 24, wherein the defined action comprises:
a detection of a signal of an application-specific integrated circuit,
a change in a position of a housing into which the matching circuit is integrated, the change being reported by a position control,
a change in power consumption,
a synchronization,
a change in transmission/reception frequency band, or
a change reported by a mechanics sensor.

27. The method according to claim 24, wherein step E3) is initiated if an RF power in the transmission frequency range lies below a critical power or a signal for transition into a waiting mode is obtained.

28. The method according to claim 1, wherein the matching circuit is provided for use at frequencies of a GSM system.

29. The method according to claim 1, wherein the matching circuit is provided for use at frequencies of a WCDMA system.

30. The method according to claim 1, wherein the matching circuit is provided for use at frequencies of FDD systems.

31. The method according to claim 1, wherein the matching circuit is provided for use in one of the following pairs of frequency ranges:
transmission frequency range: 1920-1980 MHz and reception frequency range: 2110-2170 MHz,
transmission frequency range: 1850-1910 MHz and reception frequency range: 1930-1990 MHz,
transmission frequency range: 1710-1785 MHz and reception frequency range: 1805-1880 MHz,
transmission frequency range: 1710-1755 MHz and reception frequency range: 2110-2155 MHz,
transmission frequency range: 824-849 MHz and reception frequency range: 869-894 MHz,
transmission frequency range: 830-840 MHz and reception frequency range: 875-885 MHz,
transmission frequency range: 2500-2570 MHz and reception frequency range: 2620-2690 MHz,
transmission frequency range: 880-915 MHz and reception frequency range: 925-960 MHz,
transmission frequency range: 1750-1785 MHz and reception frequency range: 1845-1880 MHz,
transmission frequency range: 1710-1770 MHz and reception frequency range: 2110-2170 MHz,
transmission frequency range: 1428-1453 MHz and reception frequency range: 1476-1501 MHz, or
transmission frequency range: 698-716 MHz and reception frequency range: 728-746 MHz.

32. The method according to claim 1,
further comprising, between steps A) and B), defining a set of permissible impedance values for each tunable impedance element depending on the selected band.

33. The method according to claim 1, further comprising:
between step A) and step B), for each tunable impedance element depending on the selected band,
a lower limit value of a real part of an impedance, which is not undershot in steps B) and D), and an upper limit value of the real part of the impedance, which is not exceeded in steps B) and D), and
a lower limit value of an imaginary part of the impedance, which is not undershot in steps B) and D), and an upper limit value of the imaginary part of the impedance, which is not exceeded in steps B) and D).

34. The method according to claim 1, wherein,
step D) comprises determining the new impedances for the transmission frequency ranges of the first and second tunable impedance elements in a manner optimized towards the respective transmission frequency range,
step E) comprises determining the impedance matching of the matching circuit during transmission time slots, and
the method is performed for the impedance matching of the front end circuit and of the planar antenna in time division duplexing operation.

35. The method according to claim 1, wherein,
step D) comprises determining the new impedances for the reception frequency ranges of the first and second tunable impedance elements in a manner dependent on impedances determined for the transmission frequency range.

36. The method according to claim 1, wherein
the first tunable impedance element is electrically connected in the signal path,
the second tunable impedance element is electrically connected between the signal path and ground,
the new impedances of the first tunable impedance element for the reception frequency range are identical to those of the transmission frequency range, and
the new impedances of the second tunable impedance element for the reception frequency range are determined from those of the transmission frequency range by subtraction of fixedly defined impedances.

37. A matching circuit comprising:
a first tunable impedance element configured to be electrically connected in a signal path between a front end circuit and a planar antenna;
a second tunable impedance element configured to be electrically connected in the signal path between the front end circuit and the planar antenna; and
a control circuit configured to simultaneously match impedances of the front end circuit and of the planar antenna in transmission and reception frequency ranges of selectable bands, the control circuit configured to cause the matching of the impedances, wherein:
the control circuit is configured to select a band,
the control circuit is configured to set initial impedances of the first and second tunable impedance elements for the selected band,
the control circuit is configured to determine an initial impedance matching of the matching circuit for the transmission frequency range of the selected band,
the control circuit is configured to determine and set new impedances of the tunable impedance elements,
the control circuit is configured to determine a new impedance matching of the matching circuit with the new impedances for transmission frequency ranges, and
the control circuit is configured to repeatedly determine and set new impedances and determine a new impedance matching of the matching circuit.

38. The matching circuit according to claim 37, wherein the second tunable impedance element is electrically connected between the signal path and ground, the matching circuit further comprising:
a first inductive element electrically connected in parallel with the second tunable impedance element between the signal path and ground; and
a second inductive element electrically connected in parallel with the second tunable impedance element between signal path and ground.

39. A communication device comprising:
a front end circuit;
a planar antenna
a first tunable impedance element electrically connected in a signal path between the front end circuit and the planar antenna;
a second tunable impedance element electrically connected in the signal path between the front end circuit and the planar antenna; and
a control circuit configured to simultaneously match impedances of the front end circuit and of the planar antenna in transmission and reception frequency ranges of selectable bands, the control circuit configured to cause the matching of the impedances, wherein:
the control circuit is configured to select a band,
the control circuit is configured to set initial impedances of the first and second tunable impedance elements for the selected band,
the control circuit is configured to determine an initial impedance matching of the matching circuit for the transmission frequency range of the selected band,
the control circuit is configured to determine and set new impedances of the tunable impedance elements,
the control circuit is configured to determine a new impedance matching of the matching circuit with the new impedances for transmission frequency ranges, and
the control circuit is configured to repeatedly determine and set new impedances and determine a new impedance matching of the matching circuit.

40. A method for dynamically matching impedances of a front end circuit and of a planar antenna in transmission and reception frequency ranges of selectable bands by a matching circuit that is electrically connected in a signal path between the front end circuit and the planar antenna and comprises a first tunable impedance element and a second tunable impedance element, the method comprising the steps of:
A) selecting a band,
B) setting initial capacitances of the first and second tunable impedance elements for the selected band, wherein the initial capacitances are within an allowed range of a capacitance ratio for the first and second tunable impedance elements depending on the selected band,
C) determining an initial impedance matching of the matching circuit for the transmission frequency ranges of the selected bands,
D) determining and setting new capacitances of the first and second tunable impedance elements by determining whether the new capacitances are within an allowed range of the capacitance ratio for the first and second tunable impedance elements depending on the selected band and setting the new capacitances only if it is determined that the new capacitances are within the allowed range,
E) determining a new impedance matching of the matching circuit with the new capacitances for the transmission frequency ranges, and
F) repeating step D.

41. The method according to claim 40, wherein:
in step B), for each tunable impedance element depending on the selected band,
a lower limit value of a capacitance, which is not undershot in steps B) and D), and an upper limit value of the capacitance, which is not exceeded in steps B) and D).

* * * * *